(12) United States Patent
Son et al.

(10) Patent No.: US 8,013,527 B2
(45) Date of Patent: Sep. 6, 2011

(54) ORGANIC LIGHT EMITTIG DIODE UNIT AND METHOD FOR MANUFACTURING THE SAME

(75) Inventors: Se-Hwan Son, Daejeon Metropolitan (KR); Hyeon Choi, Daejeon Metropolitan (KR)

(73) Assignee: LG Chem, Ltd., Seoul (KR)

( * ) Notice: Subject to any disclaimer, the term of this patent is extended or adjusted under 35 U.S.C. 154(b) by 357 days.

(21) Appl. No.: 12/226,216

(22) PCT Filed: Apr. 12, 2007

(86) PCT No.: PCT/KR2007/001783
§ 371 (c)(1),
(2), (4) Date: Apr. 24, 2009

(87) PCT Pub. No.: WO2007/117126
PCT Pub. Date: Oct. 18, 2007

(65) Prior Publication Data
US 2009/0295286 A1  Dec. 3, 2009

(30) Foreign Application Priority Data
Apr. 12, 2006  (KR) .......... 10-2006-0033119

(51) Int. Cl.
*H01J 1/62* (2006.01)
(52) U.S. Cl. .......... 313/512; 313/506; 445/24
(58) Field of Classification Search .......... 313/504, 313/506, 512
See application file for complete search history.

(56) References Cited

U.S. PATENT DOCUMENTS

| | | | |
|---|---|---|---|
| 5,711,594 A | 1/1998 | Hay | |
| 5,869,930 A * | 2/1999 | Baumberg et al. | 313/506 |
| 5,959,402 A * | 9/1999 | Polyan | 313/512 |
| 6,400,093 B1 * | 6/2002 | Baumberg et al. | 445/24 |
| 6,538,375 B1 | 3/2003 | Duggal et al. | |
| 6,686,064 B2 * | 2/2004 | Nakamura | 313/512 |
| 6,753,096 B2 * | 6/2004 | Duggal et al. | 313/506 |
| 6,771,021 B2 | 8/2004 | Cok | |
| 6,936,964 B2 | 8/2005 | Cok | |
| 7,016,577 B2 * | 3/2006 | He | 313/494 |
| 7,675,230 B2 * | 3/2010 | Kasama et al. | 313/506 |
| 2003/0038590 A1 | 2/2003 | Silvernail et al. | |
| 2003/0099858 A1 * | 5/2003 | Duggal et al. | 313/506 |
| 2005/0088087 A1 | 4/2005 | Ogawa | |
| 2005/0218461 A1 * | 10/2005 | Kasama et al. | 257/401 |
| 2006/0022592 A1 | 2/2006 | Boroson | |
| 2006/0028125 A1 | 2/2006 | Kim et al. | |
| 2006/0250075 A1 * | 11/2006 | Kasama et al. | 313/504 |
| 2010/0117112 A1 * | 5/2010 | Kasama et al. | 257/98 |

FOREIGN PATENT DOCUMENTS

| | | |
|---|---|---|
| EP | 0 766 147 A1 | 5/1997 |
| GB | 2 383 683 | 7/2003 |
| JP | 03-283292 A | 12/1991 |
| JP | 10-509553 | 9/1998 |
| JP | 2003-187962 | 7/2003 |
| JP | 2005/108643 | 4/2005 |
| JP | 2005-111702 | 4/2005 |

* cited by examiner

*Primary Examiner* — Peter Macchiarolo
(74) *Attorney, Agent, or Firm* — McKenna Long & Aldridge LLP

(57) ABSTRACT

The present invention provides an organic light emitting diode unit including: a bar-shaped organic light emitting diode body; a glass protective tube having at least one opening and housing the organic light emitting diode body; and at least one seal cover provided with a moisture absorbent at the side facing the opening and closes at least one opening of the glass protective tube, and a method of manufacturing the organic light emitting diode unit.

17 Claims, 3 Drawing Sheets

[Fig. 1]
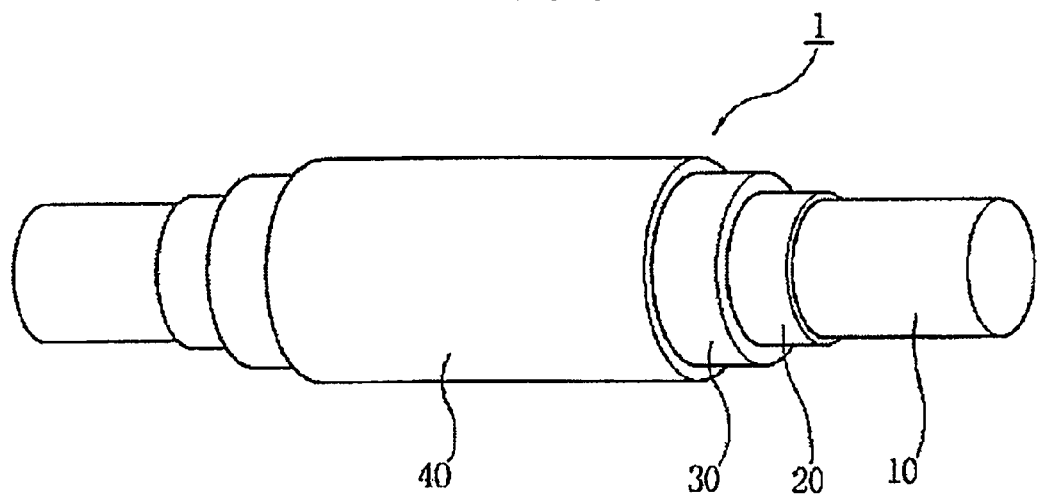
[Fig. 2]
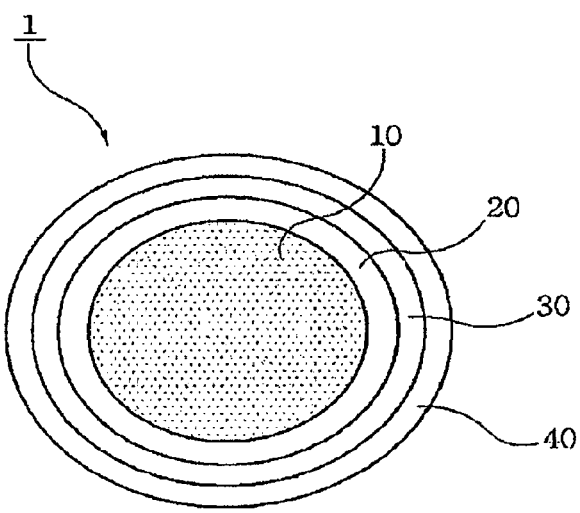

[Fig. 3]
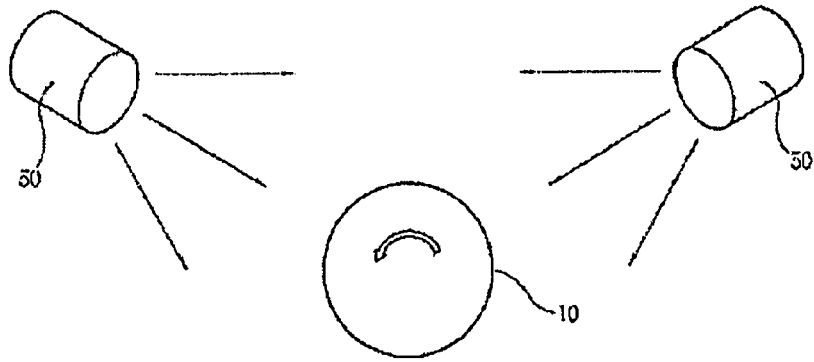
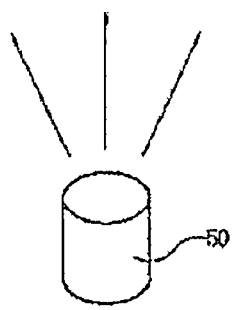
[Fig. 4]
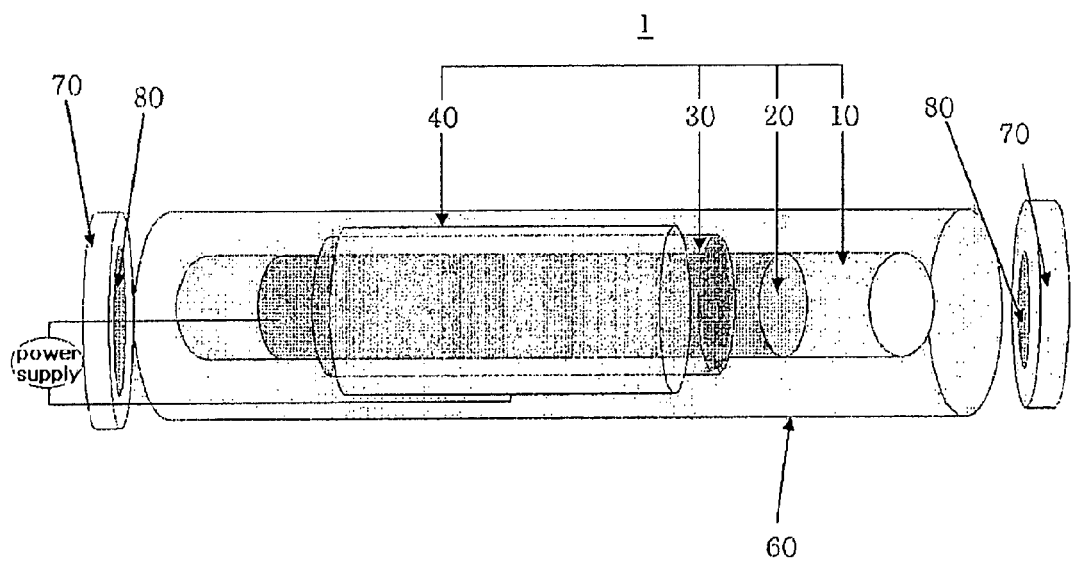

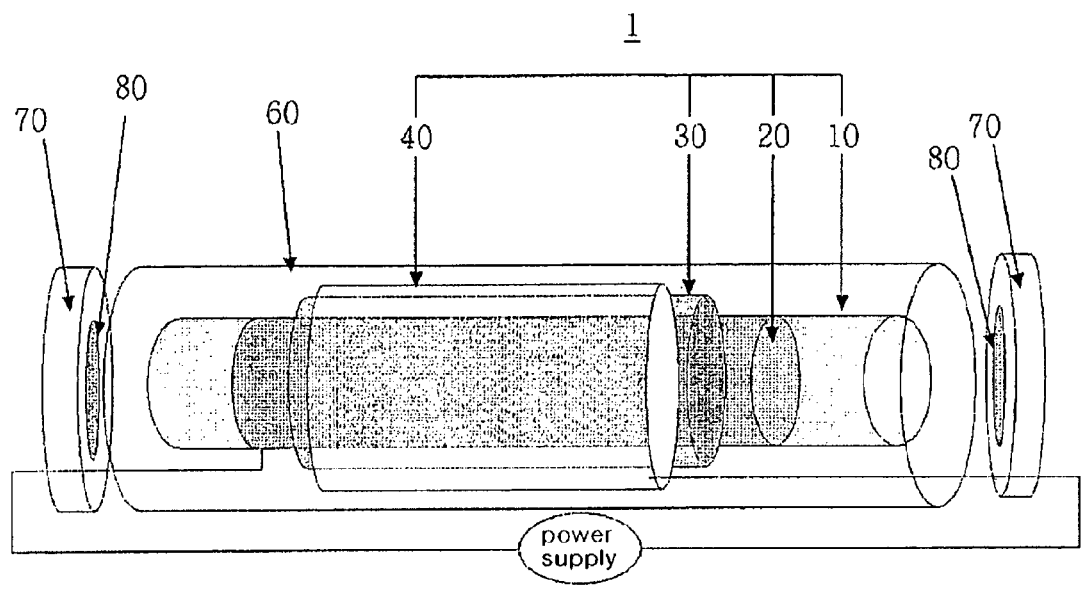
[Fig. 5]

ical Field

ORGANIC LIGHT EMITTIG DIODE UNIT AND METHOD FOR MANUFACTURING THE SAME

This application is a 371 national stage entry of International Application No. PCT/KR2007/001783, filed on Apr. 12, 2007 that claims priority to Korean Patent Application No. 10-2006-0033119, filed on Apr. 12, 2006, both of which are hereby incorporated by reference in their entirety.

TECHNICAL FIELD

The present invention relates to an organic light emitting diode unit that can protect an organic light emitting diode body against permeation of oxygen or water by housing the organic light emitting diode body in a glass protective tube and sealing the glass protective tube with seal covers, and a method of manufacturing the same.

This application claims priority benefits from Korean Patent Application No. 10-2006-0033119, filed on Apr. 12, 2006, the entire of which is fully incorporated herein by reference.

BACKGROUND ART

Organic light emitting diode unit using an organic light emitting phenomenon is being widely applied to a variety of illuminators because it can achieve high luminance using low voltage and also applied to display devices because of a low driving voltage, thin-light weight, wide viewing angle, and high-speed response, etc.

The term "organic light emitting phenomenon" refers to a phenomenon in which electric energy is converted into light energy by means of an organic material. Specifically, when an organic layer is disposed between the anode and cathode and a voltage is applied between the electrodes, holes from the anode and electrons from the cathode are injected into the organic layer. Excitons are formed by combination of the injected holes and electrons and when the excitons drop to the ground state, light is emitted.

For example, an organic light emitting diode body including a bar-shaped first electrode or a first electrode formed on a support bar, an organic layer formed on the first electrode, and a second electrode formed on the organic layer is disclosed in Japanese Patent No. 2005-108643.

However, because the organic light emitting diode body is considerably sensitive to oxygen and water, performance and life of the organic light emitting diode body may be reduced by the permeation of oxygen and water. Accordingly, a cover layer is formed on the second electrode of the organic light emitting diode body to prevent permeation of oxygen and water.

The cover layer in the related art, however, is formed on the second electrode and covers only the second electrode, not the entire organic light emitting diode body, so that it is vulnerable to permeation of oxygen and water.

DISCLOSURE OF INVENTION

Technical Problem

An object of the invention is to provide an organic light emitting diode unit that can protect an organic light emitting diode body in a closed space formed by seal covers and a glass protective tube against oxygen or water by closing openings of the glass protective tube with the seal covers after housing the organic light emitting diode body inside the glass protective tube, and a method of manufacturing the organic light emitting diode unit.

Technical Solution

According to an embodiment of the invention, provided is an organic light emitting diode unit including: a bar-shaped organic light emitting diode body; a glass protective tube having at least one opening and housing the organic light emitting diode body; and at least one seal cover provided with a moisture absorbent at the side facing the opening and closes at least one opening of the glass protective tube.

According to another embodiment of the invention, electronic device including the organic light emitting diode unit according to the invention is provided.

According to another embodiment of the invention, provided is a method of manufacturing an organic light emitting diode unit including: (a) providing a base bar; (b) depositing a first electrode around the outside of the base bar while rotating the base bar; (c) depositing an organic layer around the outside of the first electrode while rotating the base bar with the first electrode; (d) depositing a second electrode around the outside of the organic layer while rotating the base bar with the first electrode and organic layer; (e) housing the organic light emitting diode body manufactured through the steps (a) to (d) inside a glass protective tube having at least one opening; and (f) sealing the glass protective tube by closing at least one opening of the glass protective tube with at least one seal cover provided with a moisture absorbent at the side facing the opening.

According to another embodiment of the invention, provided is a method of manufacturing an organic light emitting diode unit including: (a) providing a bar-shape first electrode; (b) depositing an organic layer around the outside of the first electrode while rotating the first electrode; (c) depositing a second electrode around the outside of the organic layer while rotating the first electrode with the organic layer; (d) housing the organic light emitting diode body manufactured through steps (a) to (c) inside a glass protective tube with at least one opening; and (e) sealing the glass protective tube by closing at least one opening of the glass protective tube with at least one seal cover provided with a moisture absorbent at the side facing the opening.

The invention is described in detail hereafter.

An organic light emitting diode unit according to an embodiment of the invention includes: a bar-shaped organic light emitting diode body; a glass protective tube having at least one opening and housing the organic light emitting diode body; and at least one seal cover that closes at least one of the openings of the glass protective tube and is provided with a moisture absorbent at the side facing the opening.

The organic light emitting diode body includes a base bar, a first electrode provided around the outside of the base bar, an organic layer provided around the outside of the first electrode, and a second electrode provided around the outside of the organic layer.

The base bar may be formed of plastic or metal, and hollow or solid.

When the base bar is made of plastic, the first electrode may be formed directly on the plastic base bar or an individual metal layer that is capable of reflecting light may be formed between the plastic base bar and the first electrode.

The metal layer extracts light, generated from the organic layer toward the plastic base bar, outside the organic light emitting diode body by reflecting the light. Accordingly, light-extraction efficiency is improved. An individual metal layer may be formed between the plastic base bar and the first electrode as described above, or an individual metal layer formed on the plastic base bar may be used as the first electrode without forming a first electrode on the metal layer.

When the base bar is made of metal, the metal may be selected from gold, silver, aluminum, and alloys thereof.

When the base bar is made of metal with high reflectance, it may be possible to effectively discharge light, diffused from the organic layer toward the base bar, outside the organic light emitting diode body by reflecting the light with the metal base bar. The metal base bar itself may be used as the first electrode without forming a first electrode on the metal base bar.

As described above, when an individual metal layer is formed on a plastic base bar or a metal base bar is used, a planarization layer may be provided on the metal layer or the metal base bar to achieve appropriate flatness to the organic light emitting diode body.

The planarization layer may be made of one or more materials selected from polyimide, photoacrylic polymer, overcoat material, BCB (benzocyclobutene), and SOG (spin-on-glass) material.

One of the first electrode and second electrode may be the anode and the other the cathode. One of the first electrode and second electrode may be made of transparent conducting oxide, such as ITO (Indium Tin Oxide), IZO (Indium Zinc Oxide), and ZnO (Zinc Oxide) and the other a metal, such as magnesium, calcium, sodium, potassium, titanium, indium, yttiium, lithium, gadolinium, aluminum, silver, tin, and lead or alloy thereof; and multilayer structure materials such as LiF/Al or $LiO_2$/Al.

Preferably, the first electrode is the cathode of LiF/Al and the second electrode is the anode of transparent ITO (Indium Tin Oxide).

The organic layer may include a hole injection layer, a hole transportation layer, light emitting layer, and electron transportation layer. When voltage is applied between the first and second electrodes, holes from the anode and electrons from the cathode are injected into the organic layer. Excitons are formed by combination of the injected holes and electrons in the light emitting layer, light is generated in inactivation of the excitons, and visible light including white is generated according to the type of light emitting layer.

As described above, the organic light emitting diode body may include a base bar, a first electrode, an organic layer, and a second electrode, or, by way of another example, may include a bar-shaped first electrode, an organic layer provided around the outside of the first electrode, and a second electrode provided around the outside of the organic layer.

It is preferable that the glass protective tube that houses the organic light emitting diode body is made of glass with low oxygen and water permeability to protect the organic light emitting diode body against oxygen or water and with high light transmittance to allow light generated from the organic light emitting diode body to easily escape.

An opening may be formed at only one end of the glass protective tube.

Alternatively, a pair of openings facing each other may be formed at both ends of the glass protective tube.

When a pair of openings is formed in the glass protective tube, the openings may be closed by the seal covers provided with the moisture absorbent.

The seal cover may be formed of glass, the same as the glass protective tube, or metal, but is not limited thereto.

The number of seal covers depends on the openings of the glass protective tube. When one opening is formed in the glass protective tube, the opening may be closed by a seal cover, and when a pair of openings is formed in the glass protective tube, the openings may be closed by two seal covers.

In order to adhere the seal cover to the glass protective tube to close the openings of the glass protective tube, for example, the seal cover may be adhered to the glass protective tube by melting a portion or with an adhesive, both may be used.

The seal cover may be adhered to the glass protective tube by melting a portion of the seal cover or the portion around the opening of the glass protective tube in a variety of ways, or with an epoxy adhesive or silicon adhesive, but the adhesion method is not limited thereto.

A moisture absorbent is provided on the side facing the glass protective tube of the seal cover.

One or more substances selected from CaO and BaO may be used as the moisture absorbent. Further, a sheet-shaped moisture absorbent made of one or more substances selected from CaO and BaO with a polymer, a binder, may be used.

The moisture absorbent is provided to the seal cover by one of the methods of directly coating the moisture absorbent on the seal cover or attaching a sheet-shaped moisture absorbent to the seal cover.

Therefore, the openings may be closed by the seal covers with a moisture absorbent after the organic light emitting diode body is housed inside the glass protective tube.

Alternatively, after the organic light emitting diode body is housed inside the glass protective tube and the inner space of the glass protective tube is filled with an individual moisture absorbent, the openings may be closed by the seal covers with a moisture absorbent.

As described above, when the glass protective tube is sealed by seal covers after the organic light emitting diode body is housed in the glass protective tube, the organic light emitting diode body is protected against the permeation of oxygen or water.

According to an embodiment of the invention, the organic light emitting diode unit may further include a power supply that is disposed outside the glass protective tube, connected to the organic light emitting diode body through an electric wire, and supplies power for driving the organic light emitting diode body.

A part of the electric wire connecting the organic light emitting diode body to the power supply is connected to the organic light emitting diode body inside the glass protective tube, and the other part is led outside the glass protective tube through the seal covers and connected to the power supply (see FIGS. 4 and 5). An electric power connection of common fluorescent lamps, an illuminator, is applicable to the invention by connecting the power supply disposed outside the glass protective tube with the organic light emitting diode body with an electric wire, but it is not limited thereto.

As described above, the power supply may be provided outside the glass protective tube individually from the organic light emitting diode body, or a self-power supply, such as a battery, may be provided to the organic light emitting diode body.

According to another embodiment of the invention, electronic device includes an organic light emitting diode unit according to the invention.

The electronic device may be a display device, illuminator, billboard, or toy by way of example, but is not limited thereto.

A method of manufacturing an organic light emitting diode unit according to another embodiment of the invention includes: (a) providing a base bar; (b) depositing a first electrode around the outside of the base bar while rotating the base bar; (c) depositing an organic layer around the outside of the first electrode while rotating the base bar with the first electrode; (d) depositing a second electrode around the outside of the organic layer while rotating the base bar with the first electrode and organic layer; (e) housing the organic light emitting diode body manufactured through the steps (a) to (d) inside a glass protective tube with at least one opening; and (f) sealing the glass protective tube by closing at least one opening of the glass protective tube with at least one seal cover provided with a moisture absorbent at the side facing the opening. All of the above described in relation to the organic light emitting diode unit according to an embodiment of the invention is applied to this embodiment.

The depositions of steps (b) to (d) may be applied by one or more depositing cells.

In detail, with the base bar in rotation, the first electrode is deposited around the outside of the base bar by one or more depositing cells and then the organic layer and the second electrode are sequentially deposited. The depositions are applied with the base bar in rotation in the above, but it is possible to apply depositions while rotating the depositing cells with the base bar fixed.

In steps (b) to (d), the depositions may be applied by three depositing cells triangularly arranged around the base bar (see FIG. 3).

Since the first electrode, organic layer, and second electrode are sequentially deposited by one or more depositing cells with the base bar in rotation in steps (b) to (d), it is possible to simplify the deposition and reduce manufacturing time, and accordingly improve productivity.

Further, since the base is formed in a bar shape, the deposited area may be three times larger than a plate-shaped base in deposition, so that an organic light emitting diode unit manufactured by the method according to the invention can provide more luminance when it is applied to an illuminator that requires high luminance per unit area.

In step (f), the adhering of the seal cover to the glass protective tube to seal the glass protective tube with the seal cover may be applied by melting a portion of at least one of the glass protective tube and the seal cover and/or using an adhesive.

The method of manufacturing an organic light emitting diode unit according to the invention may further include connecting the organic light emitting diode body with a power supply disposed outside the glass protective tube through an electric wire.

A method of manufacturing an organic light emitting diode unit according to another embodiment of the invention includes: (a) providing a bar-shape first electrode; (b) depositing an organic layer around the outside of the first electrode while rotating the first electrode; (c) depositing a second electrode around the outside of the organic layer while rotating the first electrode with the organic layer; (d) housing the organic light emitting diode body manufactured through steps (a) to (c) inside a glass protective tube with at least one opening; and (e) sealing the glass protective tube by closing at least one opening of the glass protective tube with at least one seal cover provided with a moisture absorbent at the side facing the opening. All of the above described in relation to the organic light emitting diode unit according to an embodiment of the invention is applied to this embodiment.

The depositions of steps (b) and (c) may be applied by one or more depositing cells.

In detail, with the bar-shaped first electrode in rotation, the organic layer and second electrode may be sequentially deposited around the outside of the bar-shaped first electrode by one or more depositing cells. The depositions are applied with the bar-shaped first electrode in rotation in the above, but it is possible to apply depositions while rotating the depositing cells with the base bar fixed.

In steps (b) and (c), the depositions may be applied by three depositing cells triangularly arranged around the bar-shaped first electrode (see FIG. 3).

Since the organic layer and second electrode are sequentially deposited by one or more depositing cells with the bar-shaped first electrode in rotation in steps (b) and (c), it is possible to simplify the deposition and reduce manufacturing time, and accordingly improve productivity.

Further, since the first electrode is formed in a bar shape without needing an individual base bar, the deposited area may be three times larger than a plate-shaped base in deposition, so that an organic light emitting diode unit manufactured by the method according to the invention can provide more luminance when it is applied to an illuminator that requires high luminance per unit area.

In step (e), the adhering of the seal cover to the glass protective tube to seal the glass protective tube with the seal cover may be applied by melting a portion of at least one of the glass protective tube and the seal cover, or using an adhesive, or both of them.

The method of manufacturing an organic light emitting diode unit according to the invention may further include connecting the organic light emitting diode body with a power supply disposed outside the glass protective tube through an electric wire.

Advantageous Effects

According to the invention, since a glass protective tube is sealed by closing the openings of the glass protective tube with seal covers provided with a moisture absorbent after housing an organic light emitting diode body inside the glass protective tube, the organic light emitting diode body is protected inside a closed space formed by the seal covers and glass protective tube against permeation of oxygen or water.

BRIEF DESCRIPTION OF THE DRAWINGS

FIG. 1 is a view of an organic light emitting diode body according to the invention;

FIG. 2 is a cross-sectional view of the organic light emitting diode body according to the invention;

FIG. 3 is a view illustrating the manufacturing process of the organic light emitting diode body according to the invention; and FIGS. 4 and 5 are views of a glass protective tube housing the organic light emitting diode body and seal covers that seal the glass protective tube.

REFERENCE NUMERALS

1: Organic Light Emitting Diode Body
10: Base Bar
20: First Electrode
30: Organic Layer
40: Second Electrode
50: Depositing Cell
60: Glass Protective Tube
70: Seal Cover
80: Moisture absorbent

MODE FOR THE INVENTION

The invention is described hereafter in detail with reference to the accompanying drawings.

An organic light emitting diode unit according to an embodiment of the invention includes an organic light emitting diode body 1; a glass protective tube 60 having openings at both ends and housing the organic light emitting diode body 1; and a pair of seal covers 70 that close the openings of the glass protective tube 60 and is provided with moisture absorbent 80.

As shown in FIGS. 1 and 2, the organic light emitting diode body 1 includes a base bar 10; a first electrode 20 provided around the outside of the base body 10; an organic layer 30 provided around the outside of the first electrode 20; and a second electrode 40 provided around the outside of the organic layer 30.

The base bar 10 may be made of a plastic or metal, and hollow or solid.

One of the first electrode 20 and the second electrode 40 may be anode and the other cathode.

Preferably, the first electrode 20 is the cathode of LiF/Al and the second electrode 40 is the anode of a transparent ITO (Indium Tin Oxide).

The organic layer 30, though not shown in detail in FIGS. 1 and 2, may include a hole injecting layer, a hole transport layer, light emitting layer, and electron transport layer. When voltage is applied between the first and second electrodes 20, 40, holes and electrons are injected into the organic layer from the anode and cathode, respectively. Excitons are formed by combination of the injected holes and electrons in the light emitting layer, light is emitted in inactivation of the excitons, and visible light including white is generated according to the type of light emitting layer.

The organic light emitting diode body 1 having the above configuration is formed by, as shown in FIG. 3, depositing the first electrode 20 around the outside of the base bar 10 rotating in the direction of an arrow and then sequentially depositing the organic layer 30 and the second electrode 40 with three depositing cells 50. According to this embodiment, as shown in FIG. 3, the depositing cells 50 are triangularly arranged, but the number and position are not limited thereto. One or more depositing cells 50 may be enough for the deposition.

In order to protect the organic light emitting diode body 1 formed by the above process against oxygen or water, as shown in FIG. 4, the organic light emitting diode body 1 is housed in the glass protective tube 60 with a pair of openings and then sealed inside the glass protective tube 60 by closing the openings of the glass protective tube 60 with the seal covers 70.

According to this embodiment, only the organic light emitting diode body 1 is housed in the hollow glass protective tube 60, but the inside of the glass protective tube 60 may be filled with an individual moisture absorbent after the organic light emitting diode body 1 is housed inside the glass protective tube 60.

As shown in FIG. 4, an individual power supply may be provided outside the glass protective tube 60 to supply power to the organic light emitting diode body 1 housed inside the glass protective tube 60, or a built-in power, such as a battery, may be provided in the organic light emitting diode body 1.

When an individual power supply is provided outside the glass protective tube 60, a part of the electric line connecting the organic light emitting diode body 1 with the power supply may be connected to the organic light emitting diode body 1 inside the glass protective tube 60 and the other part may be led outside the glass protective tube 60 through the seal covers 70 and connected to the power supply.

The electric wire connecting the organic light emitting diode body 1 with the power supply may be variously arranged, as shown in FIGS. 4 and 5.

The hollow glass protective tube 60 with an opening at both ends may be made of low oxygen- and water-transmissive and high light-transmissive glass. Referring to FIG. 4, the glass protective tube 60 has an opening at both ends, but an opening may be formed at only one end.

The seal cover 70 is made of the same material as the glass protective tube 60 and seals the glass protective tube 60 housing the organic light emitting diode body 1 by closing the openings of the glass protective tube 60.

In order to adhere the seal cover 70 to the glass protective tube 60 to close the openings of the glass protective tube 60, for example, the seal cover 70 may be adhered to the glass protective tube 60 by melting a portion or with an adhesive such as epoxy-based adhesive.

The seal cover 70 is provided with a moisture absorbent 80 at a side facing the opening of the glass protective tube 60 to prevent water from permeating into the organic light emitting diode body 1.

The moisture absorbent 80 may be directly coated on the seal cover 70 or adhered to the seal cover 70 in a sheet shape.

One or more substance selected from CaO and BaO may be used as the moisture absorbent 80. Further, a sheet-shaped moisture absorbent made of one or more substances selected from CaO and BaO with a polymer, a binder, may be used.

As described above, according to the invention, since the organic light emitting diode body 1 is housed in a closed space defined by the glass protective tube 60 and seal covers 70 with moisture absorbents 80, the organic light emitting diode body 1 can be protected against permeation of oxygen or water.

The invention claimed is:

1. An organic light emitting diode unit, comprising:
   a bar-shaped organic light emitting diode body;
   a glass protective tube having at least one opening and housing the organic light emitting diode body; and
   at least one seal cover provided with a moisture absorbent at the side facing the opening and closing at least one opening of the glass protective tube.

2. The organic light emitting diode unit according to claim 1, wherein a pair of openings facing each other are formed at both ends of the glass protective tube,
   the openings of the glass protective tube are closed by seal covers provided with the moisture absorbent.

3. The organic light emitting diode unit according to claim 1, further comprising: a power supply that is disposed outside the glass protective tube and connected to the organic light emitting diode body through an electric wire to supply power for driving the organic light emitting diode body.

4. The organic light emitting diode unit according to claim 1, wherein the seal cover is made of glass or metal.

5. The organic light emitting diode unit according to claim 1, wherein the moisture absorbent is one or more substances selected from CaO and BaO.

6. The organic light emitting diode unit according to claim 1, wherein the moisture absorbent is a sheet made of one or more substances selected from CaO and BaO using a polymer as a binder.

7. The organic light emitting diode unit according to claim 1, wherein the moisture absorbent is provided to the seal cover by directly coating a moisture absorbent on the seal cover or adhering a sheet-shaped moisture absorbent to the seat cover.

8. The organic light emitting diode unit according to claim 1, wherein the organic light emitting diode body includes a base bar, a first electrode provided around the outside of the base bar, an organic layer provided around the outside of the first electrode, and a second electrode provided around the outside of the organic layer.

9. The organic light emitting diode unit according to claim 8, wherein the base bar is made of a material selected from gold, silver, aluminum, alloy thereof, and plastic.

10. The organic light emitting diode unit according to claim 8, wherein the organic light emitting diode body further includes a planarization layer interposed between the base bar and the first electrode.

11. The organic light emitting diode unit according to claim 10, wherein the planarization layer is made of one or more materials selected from polyimide, photoacrylic polymer, overcoat material, BCB (benzocyclobutene), and SOG (spin-on-glass) material.

12. The organic light emitting diode unit according to claim 1, wherein the organic light emitting diode body includes a bar-shaped first electrode, an organic layer provided around the outside of the first electrode, and a second electrode provided around the outside of the organic layer.

13. Electronic device including the organic light emitting diode unit according to claim 1.

14. A method of manufacturing an organic light emitting diode unit, the method comprising the steps of:
(a) providing a base bar;
(b) depositing a first electrode around the base bar while rotating the base bar;
(c) depositing an organic layer around the outside of the first electrode while rotating the base bar with the first electrode;
(d) depositing a second electrode around the outside of the organic layer while rotating the base bar with the first electrode and organic layer;
(e) housing the organic light emitting diode body manufactured through the steps (a) to (d) inside a glass protective tube having at least one opening; and
(f) sealing the glass protective tube by closing at least one opening of the glass protective tube with at least one seal cover provided with a moisture absorbent at the side facing the opening.

15. The method according to claim 14, wherein in the steps (b) to (d), the deposition is performed by one or more depositing cells.

16. A method of manufacturing an organic light emitting diode unit, the method comprising the steps of:
(a) providing a bar-shaped first electrode;
(b) depositing an organic layer around the outside of the first electrode while rotating the first electrode;
(c) depositing a second electrode around the outside of the organic layer while rotating the first electrode with the organic layer;
(d) housing the organic light emitting diode body manufactured through the steps (a) to (c) inside a glass protective tube having at least one opening; and
(e) sealing the glass protective tube by closing at least one opening of the glass protective tube with at least one seal cover provided with a moisture absorbent at the side facing the opening.

17. The method of claim 16, wherein in the steps (b) and (c), the deposition is performed by one or more depositing cells.

* * * * *